United States Patent
Laaja et al.

(10) Patent No.: US 9,407,274 B2
(45) Date of Patent: Aug. 2, 2016

(54) LOCAL OSCILLATOR INTERFERENCE CANCELLATION

(71) Applicant: Telefonaktiebolaget L M Ericsson (publ), Stockholm (SE)

(72) Inventors: Samu Laaja, Turku (FI); Sami Vilhonen, Lieto (FI)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/264,506

(22) Filed: Apr. 29, 2014

(65) Prior Publication Data

US 2015/0311908 A1 Oct. 29, 2015

(51) Int. Cl.
| H03L 7/093 | (2006.01) |
| H03L 7/099 | (2006.01) |
| H03L 7/08 | (2006.01) |

(52) U.S. Cl.
CPC .............. *H03L 7/093* (2013.01); *H03L 7/0805* (2013.01); *H03L 7/099* (2013.01)

(58) Field of Classification Search
CPC .............. H03L 7/093; H03L 7/22; H04L 1/00
See application file for complete search history.

(56) References Cited

U.S. PATENT DOCUMENTS

| 4,688,003 | A  | * | 8/1987  | Stromswold | ............ | H03L 7/081 |
|           |    |   |         |            |              | 327/147    |
| 5,311,546 | A  | * | 5/1994  | Paik et al. | ...................... | 375/232 |
| 5,541,959 | A  |   | 7/1996  | Myers |
| 6,314,145 | B1 | * | 11/2001 | van Driest | ...................... | 375/326 |
| 6,587,521 | B1 | * | 7/2003  | Matui | ............................ | 375/341 |
| 6,985,705 | B2 | * | 1/2006  | Shohara | ...................... | 455/164.1 |
| 7,372,337 | B2 |   | 5/2008  | Nayler |
| 7,405,628 | B2 |   | 7/2008  | Hulfachor et al. |
| 7,551,677 | B2 | * | 6/2009  | Crawford | ....................... | 375/260 |
| 8,031,019 | B2 | * | 10/2011 | Chawla | ................ | H03B 5/1228 |
|           |    |   |         |            |              | 331/117 FE |
| 8,093,943 | B2 | * | 1/2012  | Arai | .............................. | 329/319 |

(Continued)

FOREIGN PATENT DOCUMENTS

| EP | 1304805 A2 | 4/2003 |
| EP | 2600544 A1 | 6/2013 |
| WO | 2010089168 A1 | 8/2010 |

OTHER PUBLICATIONS

Definition of "derive", Dictionary.com, http://dictionary.reference.com/browse/derive, accessed Jan. 26, 2016.*

(Continued)

*Primary Examiner* — Thomas J Hiltunen
(74) *Attorney, Agent, or Firm* — Withrow & Terranova, PLLC

(57) ABSTRACT

Systems and methods for mitigating interference in a Local Oscillator (LO) signal generated by a Phase-Locked Loop (PLL) are disclosed. In one embodiment, a system includes a PLL and an error compensation subsystem. The PLL includes a Controlled Oscillator (CO) that provides a LO output signal based on a control signal, a phase detector that generates a phase detector output signal that is indicative of a phase error between a feedback signal that is a function of the LO output signal and a reference signal, and a loop filter that filters the phase detector output signal to provide the control signal for the CO. The error compensation subsystem applies, based on the phase detector output signal, a phase rotation to a signal derived from the LO output signal to thereby compensate for a phase error in the signal resulting from a phase error in the local oscillator output signal.

12 Claims, 6 Drawing Sheets

(56) References Cited

U.S. PATENT DOCUMENTS

| | | | |
|---|---|---|---|
| 8,154,329 B2* | 4/2012 | Ecklund et al. | 327/159 |
| 8,198,930 B2 | 6/2012 | Zerbe et al. | |
| 8,212,611 B2* | 7/2012 | Akhtar | H03D 7/1441 |
| | | | 327/565 |
| 8,222,939 B2 | 7/2012 | Takinami et al. | |
| 8,229,372 B2* | 7/2012 | Hoyerby | H03F 1/32 |
| | | | 330/129 |
| 8,339,208 B2 | 12/2012 | Luong et al. | |
| 8,384,452 B1* | 2/2013 | Parker | H03L 7/07 |
| | | | 327/147 |
| 2002/0105389 A1 | 8/2002 | Nishimura et al. | |
| 2004/0119514 A1 | 6/2004 | Karlquist | |
| 2004/0120418 A1 | 6/2004 | Pasternak et al. | |
| 2004/0189361 A1 | 9/2004 | Jung | |
| 2005/0186920 A1 | 8/2005 | Staszewski et al. | |
| 2006/0103566 A1 | 5/2006 | Vemulapalli et al. | |
| 2007/0194811 A1 | 8/2007 | Nitsche et al. | |
| 2008/0192877 A1 | 8/2008 | Eliezer et al. | |
| 2010/0315169 A1* | 12/2010 | Filipovic | H03L 7/093 |
| | | | 331/11 |
| 2011/0187426 A1 | 8/2011 | Moore | |
| 2011/0299572 A1 | 12/2011 | Monsen et al. | |
| 2013/0229213 A1 | 9/2013 | Park et al. | |
| 2013/0243044 A1 | 9/2013 | Husted et al. | |
| 2013/0271186 A1 | 10/2013 | Hossain et al. | |
| 2014/0347108 A1 | 11/2014 | Zerbe et al. | |

OTHER PUBLICATIONS

Author Unknown, "3rd Generation Partnership Project; Technical Specification Group Radio Access Network; Evolved Universal Terrestrial Radio Access (E-UTRA); User Equipment (UE) radio transmission and reception (Release 11)," Technical Specification 36.101, Version 11.4.0, Mar. 2013, 3GPP Organizational Partners, 401 pages.

Mirzaei, Ahmad et al., "21.8 A Pulling Mitigation Technique for Direct-Conversion Transmitters," 2014 IEEE International Solid-State Circuits Conference, Session 21, San Francisco, CA, Feb. 9-13, 2014, IEEE, pp. 374-375.

Non-Final Office Action for U.S. Appl. No. 14/259,485, mailed Jul. 30, 2015, 8 pages.

Notice of Allowance for U.S. Appl. No. 14/449,468, mailed Aug. 7, 2015, 8 pages.

International Search Report for International Patent Application No. PCT/EP20151058283, mailed Jul. 14, 2015, 3 pp.

International Search Report for International Patent Application No. PCT/EP20151058982, mailed Jul. 24, 2015, 4 pp.

International Search Report for International Patent Application No. PCT/EP2015/064623, mailed Nov. 16, 2015, 3 pages.

Final Office Action for U.S. Appl. No. 14/259,485, mailed Jan. 21, 2016, 9 pages.

\* cited by examiner

LOCAL OSCILLATOR INTERFERENCE CANCELLATION

FIELD OF THE DISCLOSURE

The present disclosure relates to compensating for interference in a local oscillator output signal of a Phase Locked Loop (PLL).

BACKGROUND

Third Generation Partnership Project (3GPP) Long Term Evolution (LTE) specifications starting with LTE Release 11 utilize carrier aggregation. Carrier aggregation is a technique by which multiple frequency bands, which for LTE are multiple 20 Megahertz (MHz) frequency bands, are aggregated for downlink or uplink transmission. A 3GPP LTE cellular transceiver that supports carrier aggregation can be configured to simultaneously transmit in multiple frequency bands and/or simultaneously receive in multiple frequency bands.

Currently, there is high interest in a single-chip cellular transceiver that supports carrier aggregation. One of the many design challenges for such a transceiver is Local Oscillator (LO) frequency planning. LO frequency planning refers to the selection of the LO frequencies. In order to operate according to a carrier aggregation scheme, a single-chip cellular transceiver includes multiple Phase Locked Loops (PLLs) to generate LO signals necessary for downconversion and/or upconversion for multiple frequency bands. The number of different frequency band combinations that have to be supported by the single-chip cellular transceiver for carrier aggregation is large and new combinations are being introduced all the time. Many of these combinations require multiple PLLs to be enabled simultaneously.

One challenge in frequency planning that is particularly problematic for a single-chip carrier aggregation cellular transceiver comes from the fact that the controlled oscillators (COs) in the PLLs are sensitive to interference. For example, two PLLs running at the same frequency, or approximately the same frequency, interfere with each other. This interference degrades the noise performance of the PLLs. This same problem occurs if the PLLs run at frequencies that have a harmonic relation (i.e., a harmonic of the LO frequency of one PLL is the same as or approximately the same as the LO frequency of another PLL). In a receiver, this interference results in degradation of throughput due to phase noise sidebands in the LO signal used for downconversion. During downconversion (i.e., mixing), these phase noise sidebands mix parts of the received signal on top of itself.

In light of the discussion above, there is a need for systems and methods for mitigating interference in a LO signal generated by a PLL.

SUMMARY

Systems and methods for mitigating interference in a Local Oscillator (LO) signal generated by a Phase Locked Loop (PLL) are disclosed. In one embodiment, a system includes a PLL and an error compensation subsystem. The PLL includes a Controlled Oscillator (CO) adapted to provide a LO output signal based on a control signal, a phase detector adapted to generate a phase detector output signal that is indicative of a phase error between a feedback signal that is a function of the LO output signal and a reference signal, and a loop filter adapted to filter the phase detector output signal to provide the control signal for the CO. The error compensation subsystem is adapted to apply, based on the phase detector output signal, a phase rotation to a signal derived from the LO output signal to thereby compensate for a phase error in the signal resulting from a phase error in the LO output signal indicated by the phase detector output signal.

In one embodiment, the phase rotation is a function of a phase error indicated by the phase detector output signal. In another embodiment, the phase rotation is opposite to a phase error indicated by the phase detector output signal.

In one embodiment, the signal derived from the LO output signal is a signal downconverted from a first frequency to a second frequency based on a LO signal for downconversion that is a function of the LO output signal.

In another embodiment, the signal derived from the LO output signal is a signal upconverted from a first frequency to a second frequency based on a LO signal for upconversion that is a function of the LO output signal.

In one embodiment, the system further includes a receiver chain adapted to downconvert a radio frequency signal based on a LO signal for downconversion that is a function of the LO output signal to thereby provide a downconverted signal and process the downconverted signal to provide a digital downconverted signal. In this embodiment, the signal derived from the LO output signal is the digital downconverted signal such that the error compensation subsystem is adapted to apply the phase rotation to the digital downconverted signal based on the phase detector output signal to thereby compensate for the phase error in the digital downconverted signal resulting from the phase error in the LO output signal.

Further, in one embodiment, the error compensation subsystem includes a phase rotator adapted to generate a compensation signal having a phase that corresponds to the phase rotation to be applied to the digital downconverted signal based on the phase detector output signal, and a multiplier adapted to multiply the compensation signal and the digital downconverted signal to thereby apply the phase rotation to the digital downconverted signal. Further, in one embodiment, the system further includes a divide-by-N circuit adapted to divide the LO output signal by N to provide the LO signal for downconversion, wherein N is an integer greater than 1. In this embodiment, the error compensation subsystem further includes a divide-by-N circuit adapted to divide the phase detector output signal by N to provide a modified phase detector output signal, and the phase rotator is adapted to generate the compensation signal having the phase that corresponds to the phase rotation to be applied to the digital downconverted signal based on the modified phase detector output signal. In one embodiment, the phase rotation is opposite to a phase error indicated by the modified phase detector output signal.

In one embodiment, the phase detector is a digital phase detector. Further, in one embodiment, the phase error in the LO output signal indicted by the phase detector output signal includes a phase error resulting from an interfering signal that falls outside a bandwidth of the PLL but inside a bandwidth of the digital phase detector.

In one embodiment, a method of compensating for a phase error in a signal derived from a LO output signal output by a PLL includes generating a compensation signal having a phase that is a function of a phase error indicated by an output signal of a phase detector of the PLL, and multiplying the compensation signal and a signal derived from the LO output signal to thereby apply a phase rotation to the signal derived from the LO output signal that compensates for a phase error in the signal resulting from a phase error in the LO output signal indicated by the output signal of the phase detector of the PLL.

Those skilled in the art will appreciate the scope of the present disclosure and realize additional aspects thereof after reading the following detailed description of the embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 5:
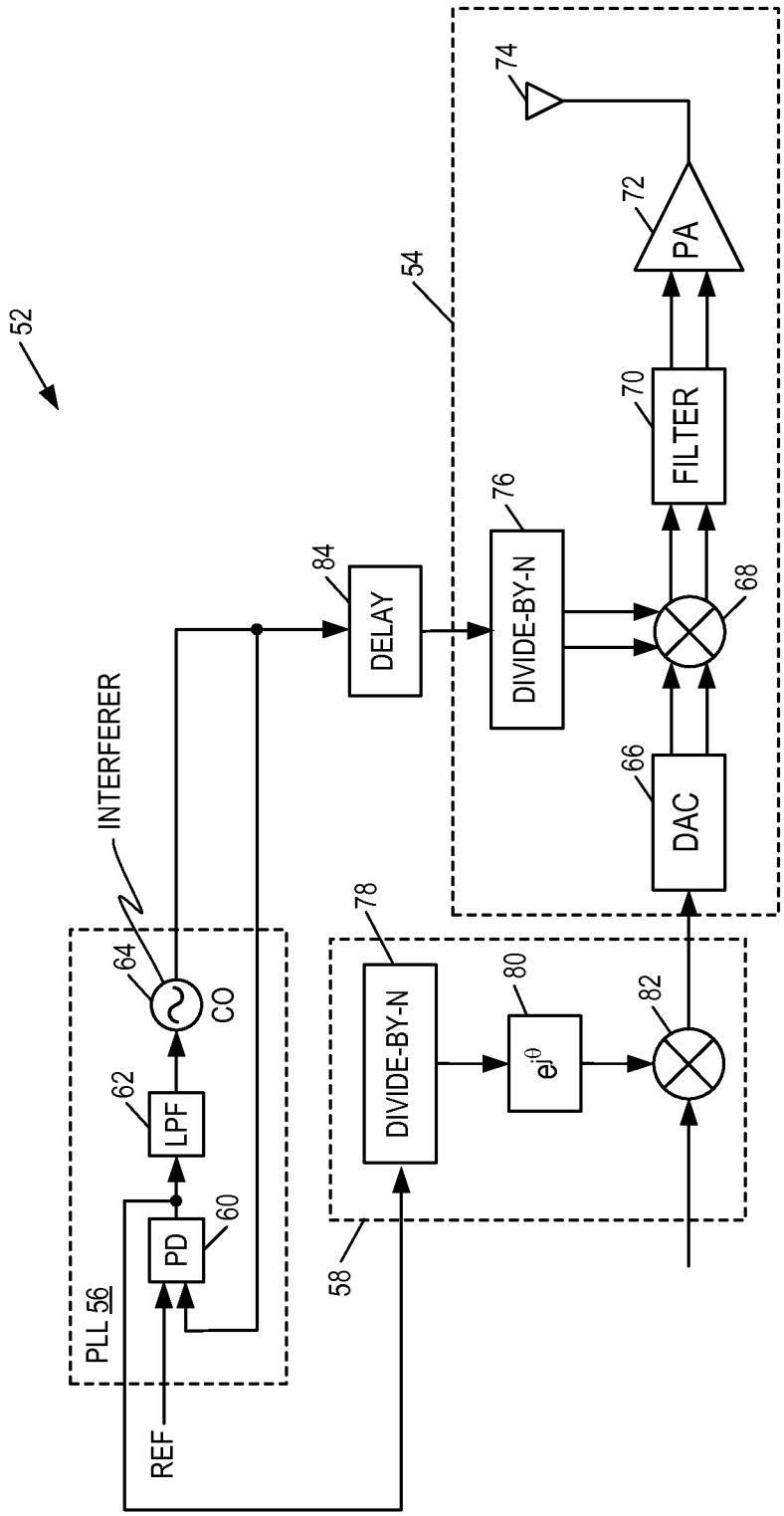
Figure 6:
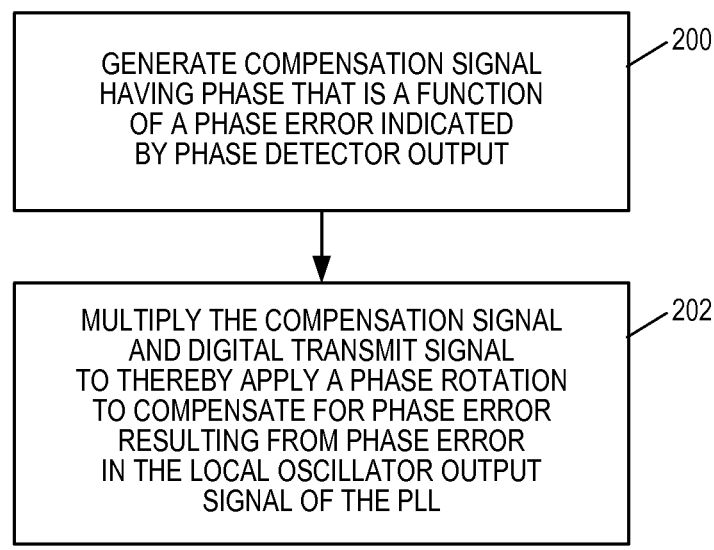

FIG. 5 illustrates a system that mitigates interference in a LO signal output by a PLL utilizing an output signal of a phase detector of the PLL according to another embodiment of the present disclosure; and FIG. 6 is a flow chart that illustrates a process for mitigating interference in a LO signal output by a PLL utilizing an output signal of a phase detector of the PLL according to another embodiment of the present disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
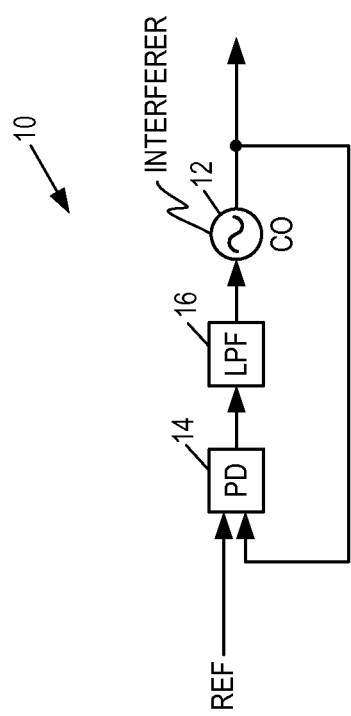
FIG. 1 illustrates a Phase Locked Loop (PLL), where an interferer is injected into a Controlled Oscillator (CO) of the PLL.

Systems and methods for mitigating interference in a Local Oscillator (LO) signal generated by a Phase Locked Loop (PLL) are disclosed. Prior to describing embodiments of the present disclosure, a brief discussion of a PLL 10 and the manner in which interference effects an output spectra of the PLL 10 is provided with respect to FIGS. 1 and 2. As illustrated in FIG. 1, the PLL 10 typically includes a Controlled Oscillator (CO) 12 (e.g., a Digitally Controlled Oscillator (DCO) or a Voltage Controlled Oscillator (VCO)) that generates a LO signal at a desired LO frequency ($f_{LO}$) based on a control signal provided by the PLL 10. In this example, the control signal provided to the CO 12 is provided by a Phase Detector (PD) 14 and a loop filter 16, which is more specifically a Low-Pass Filter (LPF). In operation, the phase detector 14 compares a phase of a reference signal which is typically provided by a stable reference oscillator (e.g., a crystal oscillator) and a phase of a feedback signal that is a function of the LO signal output by the CO 12. In the illustrated example, the feedback signal is the LO signal. However, in other implementations, the PLL 10 also includes a divider in feedback path that divides the LO signal output by the CO 12 by a factor (N) to provide the feedback signal for the phase detector 14. The phase detector 14 outputs a signal that is indicative of a phase error between the reference signal and the feedback signal. The output signal of the phase detector 14 is filtered by the loop filter 16 to provide the control signal for the CO 12.

Figure 2:
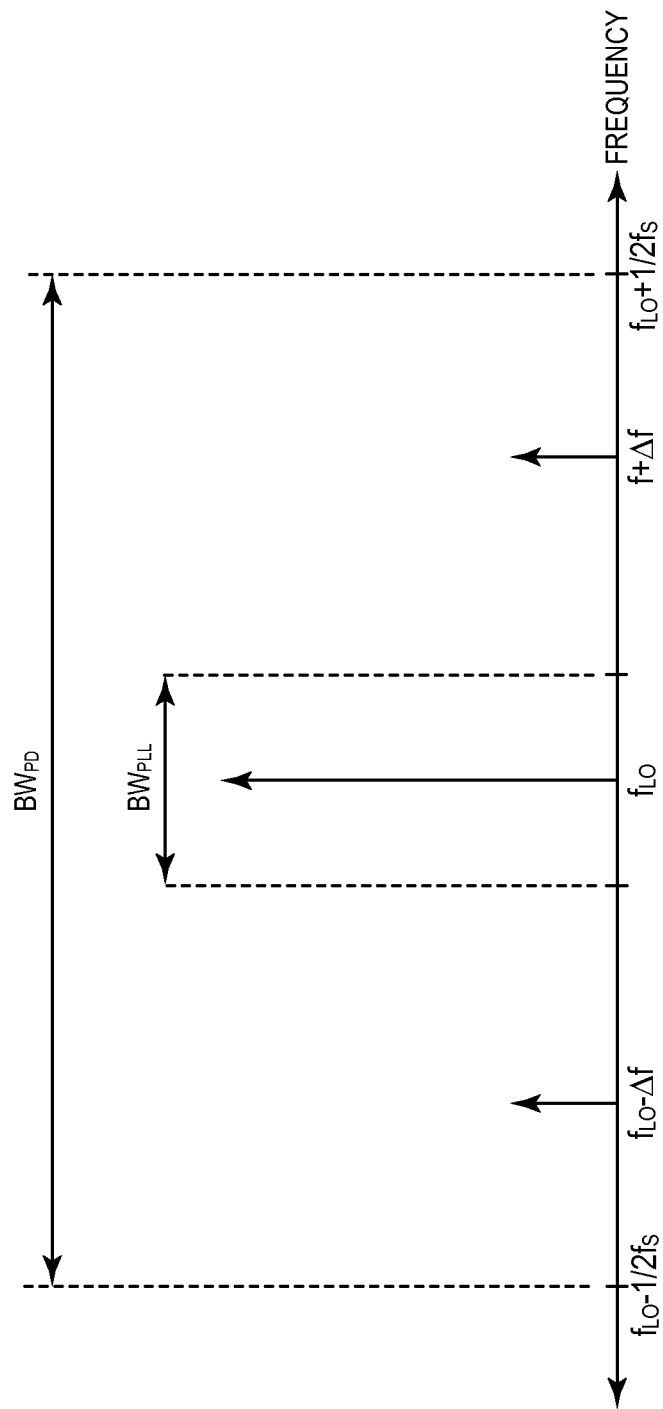
FIG. 2 illustrates an output spectrum of the PLL of FIG. 1.

As illustrated, an interferer is injected into the CO 12. The interferer is located at a frequency ($f_{INT}$), where in this example $f_{INT}=f_{LO}+\Delta f$. Alternatively, the frequency $f_{INT}$ may be equal to $f_{LO}-\Delta f$. In either case, the results are the same. The amplitude limiting function of the CO 12 converts the interferer into a phase modulation of the CO 12, which in turn results in a symmetric phase-modulated output spectra for the CO 12. As illustrated in FIG. 2, the symmetric phase-modulated output spectra for the CO 12 includes a first modulation sideband located at $f_{LO}+\Delta f$ (which is equal to $f_{INT}$ in this example) and a second modulation sideband located at $f_{LO}-\Delta f$, where $\Delta f=|f_{LO}-f_{INT}|$. If the interferer falls within a bandwidth of the PLL 10 ($BW_{PLL}$) (i.e., $\Delta f$ is small), then the interferer will be mitigated by the normal phase correction mechanism of the PLL 10. The bandwidth of the PLL 10 ($BW_{PLL}$) is typically small (e.g., about 100 kilohertz (kHz)). Note that the mitigation, or attenuation, of the interferer by the normal phase correction mechanism of the PLL 10 is finite (i.e., the PLL 10 will not completely cancel the interferer), and the amount of attenuation is inversely proportional to the frequency offset between the oscillator frequency ($f_{LO}$) and the interferer. While the PLL 10 is able to mitigate the interferer if the interferer falls within the bandwidth of the PLL ($BW_{PLL}$), the PLL 10 is not able to mitigate the interferer if the interferer is located outside of the bandwidth of the PLL 10 ($BW_{PLL}$) as illustrated in FIG. 2. In this case, the interferer is present in the LO signal output by the PLL 10 and, as such, performance of any systems that utilize the LO signal (e.g., a receiver or a transmitter) is degraded.

Embodiments of the present disclosure leverage the fact that a bandwidth of the phase detector 14 ($BW_{PD}$) is much wider than the bandwidth of the PLL 10 ($BW_{PLL}$), as also illustrated in FIG. 2. For example, if the phase detector 14 is a digital phase detector 14 that operates at a desired sampling rate ($f_S$) (e.g., 56 Megahertz (MHz)), then the bandwidth of the phase detector 14 extends from $f_{LO}-f_S/2$ to $f_{LO}+f_S/2$. As such, the phase detector 14 is capable of detecting the phase error of the interferer as long as $f_{INT}$ is in the range of $f_{LO}\pm f_S/2$. As discussed below, embodiments of the present disclosure utilize the output signal of the phase detector 14 to mitigate interference within the bandwidth of the phase detector 14 ($BW_{PD}$).

Figure 3:
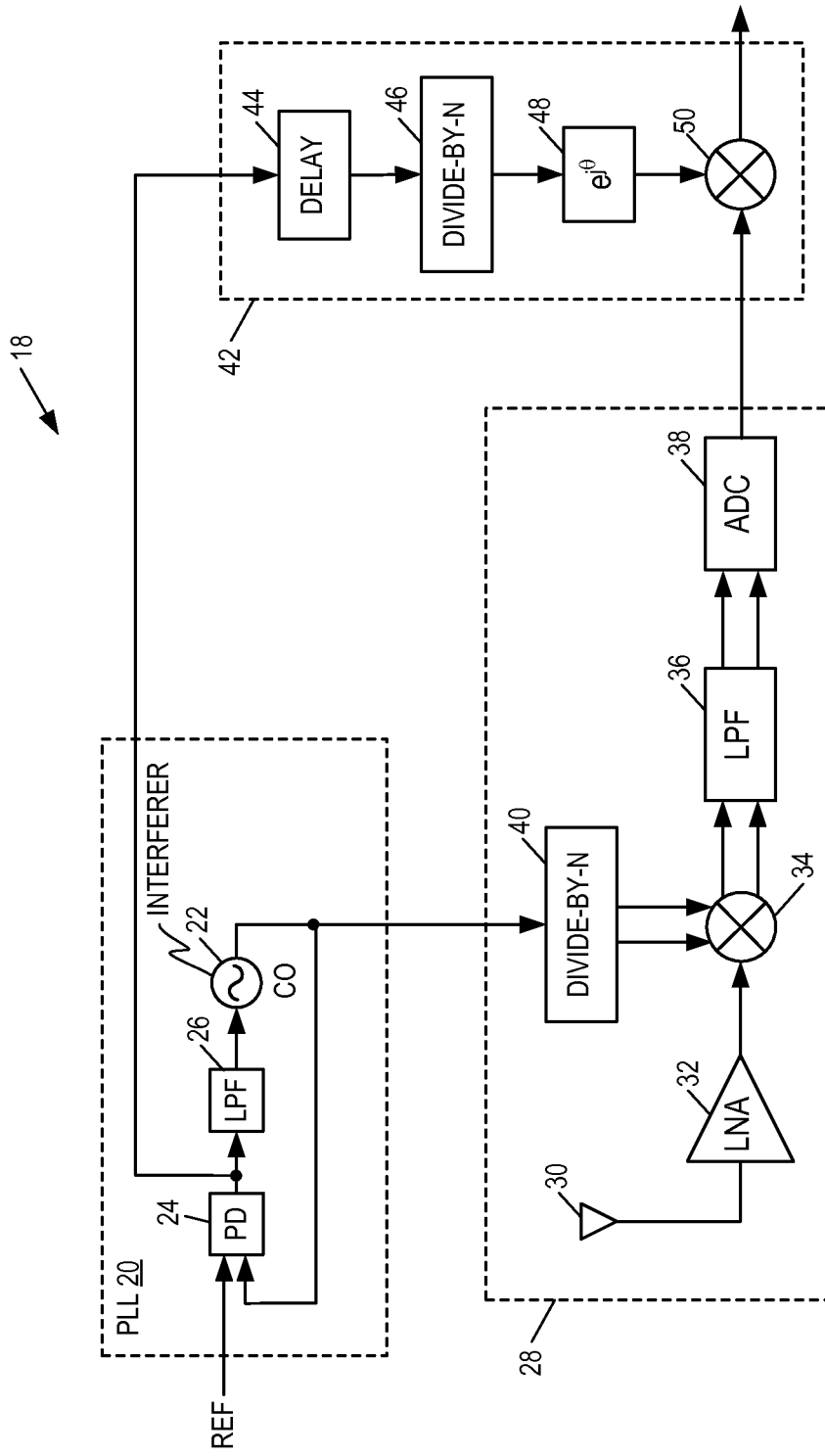
FIG. 3 illustrates a system that mitigates interference in a Local Oscillator (LO) signal output by a PLL utilizing an output signal of a phase detector of the PLL according to one embodiment of the present disclosure.

FIG. 3 illustrates a system 18 that mitigates interference in a LO signal output by a PLL 20 according to one embodiment of the present disclosure. In this embodiment, the PLL 20 includes a CO 22, which may be, e.g., a DCO or a VCO, a phase detector 24, and a loop filter 26. The loop filter 26 is a low-pass filter. While not illustrated, the PLL 20 may include other components, depending on the particular implementation. For instance, the PLL 20 may further include a divider or phase quantizer in the feedback path. The phase detector 24 is a digital phase detector that measures a phase error between a feedback signal that is a function of the output of the CO 22 and a reference signal, which is provided by a stable reference oscillator such as, e.g., a crystal oscillator. In this example, the feedback signal is the output of the CO 22; however, in other embodiments, the feedback path may include, e.g., a frequency divider. The phase detector 24 outputs a signal at a sampling rate of the phase detector 24, where each sample of the output signal represents the instantaneous phase error. The loop filter 26 is required for loop stability and attenuation of high-frequency noise from the phase detector 24.

In operation, the phase detector 24 measures the phase error between the feedback signal and the reference signal and outputs the signal that is indicative of the measured phase error. For this example, an interferer (e.g., a harmonic of another PLL in the same integrated circuit) is present in the LO signal output by the CO 22. As such, the measured phase error will also include an error due to the interferer. The feedback loop of the PLL 20 will correct some of the phase error caused by the interference, but some residual phase error will remain due to the limited bandwidth of the PLL 20.

In this embodiment, the LO signal output by the PLL 20 is utilized for downconversion in an associated receiver chain 28. In this example, the receiver chain 28 includes an antenna 30, a Low Noise Amplifier (LNA) 32, a mixer 34, a low-pass filter 36, and an Analog-to-Digital Converter (ADC) 38 connected in series. Note, however, that the receiver chain 28 may include additional or alternative components depending on the particular implementation. In operation, a Radio Frequency (RF) signal received by the antenna 30 is amplified by the LNA 32 and then downconverted to a desired frequency (e.g., baseband) via the mixer 34. More specifically, the mixer 34 mixes the amplified RF signal and a LO signal for downconversion that is a function of the LO signal output by the PLL 20. In this embodiment, the LO signal output by the PLL 20 is divided by a divide-by-N circuit 40 to thereby provide the LO signal for downconversion at a frequency that is $1/N^{th}$ the frequency of the LO signal. By mixing the amplified RF signal and the LO signal for downconversion, the amplified RF signal is downconverted to the desired frequency. The downconverted signal is then filtered by the low-pass filter 36 and digitized by the ADC 38 to provide a digital receive signal (which is also referred to herein as a digital downconverted signal).

Since the LO signal output by the PLL 20 includes modulation sidebands resulting from the interferer (which may be referred to herein as noise sidebands), the LO signal for downconversion will also include modulation sidebands. When mixing the LO signal for downconversion with the amplified RF signal, in the frequency domain, the modulation sidebands will mix frequency-shifted and attenuated versions of the amplified RF signal on top of the wanted signal, thereby degrading the signal-to-noise ratio. If the same phenomenon is analyzed in the time domain, it appears as the received constellation rotating back and forth around the correct phase at a frequency equal to the frequency difference between $f_{LO}$ and $f_{INT}$. Since the phase error at each time instant (i.e., at the sampling rate/frequency of the phase detector 24) is known, the erroneously rotated receiver constellation can be rotated back using a digital phase rotator. In other words, the error in the digital receive signal due to the interferer present in the CO 22 of the PLL 20 can be mitigated, or compensated for, by applying an appropriate phase rotation to the digital receive signal, where the phase rotation for each time instant can be derived from, or is a function of, a corresponding instantaneous phase error detected by the phase detector 24.

In this regard, the system 18 further includes an error compensation subsystem 42 that includes a delay circuit 44, a divide-by-N circuit 46, a digital phase rotator 48, and a multiplier 50 (which may also be referred to as a digital mixer). Note that the order of the delay circuit 44 and the divide-by-N circuit 46 may vary depending on the particular implementation. The amount of delay applied by the delay circuit 44 is such that the delay from the output of the phase detector 24 to the input of the multiplier 50 through the compensation path (i.e., the path through the error compensation subsystem 42) is the same as the delay from the output of the phase detector 24 to the input of the multiplier 50 through the PLL 20 and the receiver chain 28 (i.e., the main path). In other words, the delay applied by the delay circuit 44 is such that, for each time instant, the phase rotation applied by the digital phase rotator 48 is time-aligned with the corresponding phase error in the digital receive signal input to the multiplier 50.

In operation, the output of the phase detector 24 is delayed and divided by a factor N by the delay circuit 44 and the divide-by-N circuit 46, respectively. The factor N for the divide-by-N circuit 46 is the same as the factor N for the divide-by-N circuit 40. Note that the divide-by-N circuits 40 and 46 are optional. The resulting phase error is provided to the digital phase rotator 48. The digital phase rotator 48 outputs a compensation signal that, at each time instant, has a phase that is opposite (i.e., same magnitude but opposite sign) the phase error input to the digital phase rotator 48. The multiplier 50 multiplies the digital receive signal and the compensation signal to thereby apply a phase rotation to the digital receive signal that compensates for the phase error in the digital receive signal resulting from the phase error in the LO signal output by the PLL 20 (e.g., due to the interferer present at the CO 22 of the PLL 20). The output of the multiplier 50 is a compensated digital receive signal.

Figure 4:
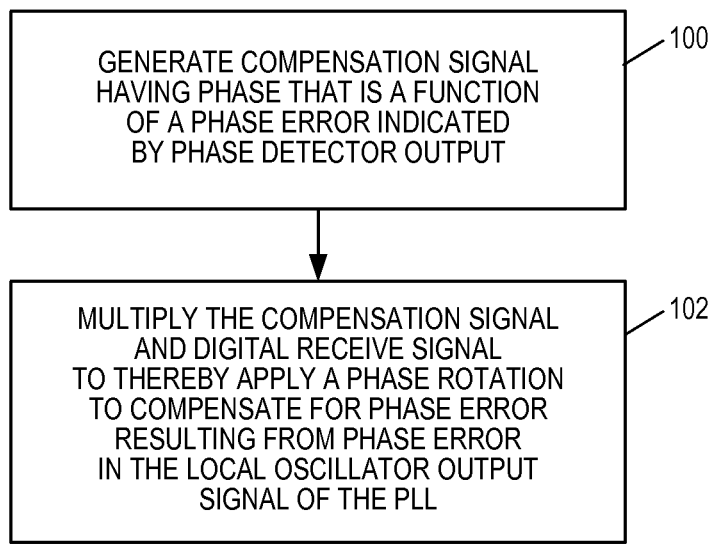
FIG. 4 is a flow chart that illustrates a process for mitigating interference in a LO signal output by a PLL utilizing an output signal of a phase detector of the PLL according to one embodiment of the present disclosure.

FIG. 4 is a flow chart that illustrates a process for mitigating interference to a PLL according to one embodiment of the present disclosure. This process is described with respect to the system 18 of FIG. 3. However, the process is not limited thereto. A compensation signal having a phase that is a function of a phase error indicated by the output of the phase detector 24 of the PLL 20 is generated (step 100). In one embodiment, the phase of the compensation signal is opposite to the phase error indicated by the output signal of the phase detector 24. More specifically, if the divide-by-N circuits 40 and 46 are either not present or N is set to 1, then the phase of the compensation signal is opposite to the phase error indicated by the output signal of the phase detector 24 (after time-alignment). If N is greater than 1, then the phase of the compensation signal is opposite to the phase error indicated by the divided output signal of the phase detector 24 (after time-alignment). The compensation signal and the digital receive signal are multiplied to thereby apply a phase rotation to the digital receive signal that compensates for a phase error in the digital receive signal resulting from the phase error in the LO signal output by the PLL 20 (e.g., due to the interferer present at the CO 22 of the PLL 20) (step 102).

While the embodiments above describe error compensation for the receiver chain 28, the present disclosure is not limited thereto. For instance, FIG. 5 illustrates a system 52 that provides error compensation in a transmitter 54. The system 52 includes a PLL 56, the transmitter 54, and an error compensation subsystem 58 similar to that described above. Like the PLL 20 described above, the PLL 56 includes, in this embodiment, a phase detector 60, a loop filter 62, and a CO 64. The transmitter 54 includes a Digital-to-Analog Converter (DAC) 66, a mixer 68, a filter 70, a Power Amplifier (PA) 72, and an antenna 74 connected in series. Note that the transmitter 54 is only an example. The details of the transmitter 54 will vary depending on the particular implementation. In operation, the transmitter 54 receives a compensated digital transmit signal from the error compensation subsystem 58. The DAC 66 converts the compensated digital transmit signal to an analog transmit signal, which is then upconverted by the mixer 68. In particular, the mixer 68 mixes the analog transmit signal with a LO signal for upconversion to thereby upconvert the analog transmit signal to a desired RF. The LO signal for upconversion is a function of the LO signal output by the PLL 56. In this particular embodiment, the LO signal output by the PLL 56 is divided by a divideby-N circuit 76 to provide the LO signal for upconversion. After upconversion, the RF transmit signal is filtered and amplified by the filter 70 and power amplifier 72, respectively, to thereby provide an amplified RF transmit signal that is then transmitted via the antenna 74.

In this embodiment, an interferer is present at the CO 64 of the PLL 56. As discussed above, the interferer results in modulation sidebands in the output signal of the PLL 56, which in turn result in modulation sidebands in the LO signal for upconversion. In order to compensate for a phase error caused by the modulation sidebands in the LO signal for upconversion, the error compensation subsystem 58 compensates a digital transmit signal to thereby provide the compensated digital transmit signal. More specifically, the error compensation subsystem 58, a divide-by-N circuit 78, a digital phase rotator 80, and a multiplier 82 (which may also be referred to as a digital mixer). Note that in order to provide proper time alignment between the compensation and the corresponding phase error at the mixer 68, a delay circuit 84 applies an appropriate delay.

In operation, the output of the phase detector 60 is divided by a factor N by the divide-by-N circuit 78. The factor N for the divide-by-N circuit 78 is the same as the factor N for the divide-by-N circuit 76. Note that the divide-by-N circuits 76 and 78 are optional. The resulting phase error is provided to the digital phase rotator 80. The digital phase rotator 80 outputs a compensation signal that, at each time instant, has a phase that is opposite (i.e., same magnitude but opposite sign) the phase error input to the digital phase rotator 80. The multiplier 82 multiplies the digital transmit signal and the compensation signal to thereby apply a phase rotation to the digital transmit signal that compensates for the phase error in the output signal of the mixer 68 resulting from the phase error in the LO signal output by the PLL 56 (e.g., due to the interferer present at the CO 64 of the PLL 56). The output of the multiplier 82 is the compensated digital transmit signal.

FIG. 6 is a flow chart that illustrates a process for mitigating interference to a PLL according to another embodiment of the present disclosure. This process is described with respect to the system 52 of FIG. 5. However, the process is not limited thereto. A compensation signal having a phase that is a function of a phase error indicated by the output of the phase detector 60 of the PLL 56 is generated (step 200). In one embodiment, the phase of the compensation signal is opposite to the phase error indicated by the output signal of the phase detector 60. More specifically, if the divide-by-N circuits 76 and 78 are either not present or N is set to 1, then the phase of the compensation signal is opposite to the phase error indicated by the output signal of the phase detector 60. If N is greater than 1, then the phase of the compensation signal is opposite to the phase error indicated by the divided output signal of the phase detector 60. The compensation signal and the digital transmit signal are multiplied to thereby apply a phase rotation to the digital transmit signal that compensates for a phase error in the LO signal for upconversion resulting from the phase error in the LO signal output by the PLL 56 (e.g., due to the interferer present at the CO 64 of the PLL 56) (step 202). Further, by applying the phase rotation to the digital transmit signal, the error compensation subsystem 58 is, in effect, applying a phase rotation to the upconverted transmit signal that compensates for the phase error in the LO signal for upconversion.

The following acronyms are used throughout this disclosure.

3GPP Third Generation Partnership Project
ADC Analog-to-Digital Converter
CO Controlled Oscillator
DAC Digital-to-Analog Converter
DCO Digitally Controlled Oscillator
kHz Kilohertz
LNA Low Noise Amplifier
LO Local Oscillator
LPF Low-Pass Filter
LTE Long Term Evolution
MHz Megahertz
PA Power Amplifier
PD Phase Detector
PLL Phase Locked Loop
RF Radio Frequency
VCO Voltage Controlled Oscillator Those skilled in the art will recognize improvements and modifications to the embodiments of the present disclosure. All such improvements and modifications are considered within the scope of the concepts disclosed herein and the claims that follow.

What is claimed is:

1. A system comprising:
   a phase locked loop comprising:
      a controlled oscillator adapted to provide a local oscillator output signal based on a control signal;
      a phase detector adapted to generate a phase detector output signal that is indicative of a phase error between a feedback signal that is a function of the local oscillator output signal and a reference signal; and
      a loop filter adapted to filter the phase detector output signal to provide the control signal for the controlled oscillator;
   a receiver chain comprising a first divider circuit adapted to divide the local oscillator output signal to thereby provide a frequency-divided local oscillator signal having a frequency that is a function of a frequency of the local oscillator output signal, the receiver chain further being adapted to:
      downconvert a radio frequency signal based on the frequency-divided local oscillator signal to thereby provide a downconverted signal; and
      process the downconverted signal to provide a digital downconverted signal; and
   an error compensation subsystem adapted to apply, based on the phase detector output signal, a phase rotation to the digital downconverted signal to thereby compensate for a phase error in the digital downconverted signal resulting from a phase error in the local oscillator output signal indicated by the phase detector output signal, wherein the error compensation subsystem comprises:
      a second divider circuit adapted to divide the phase detector output signal to thereby provide a modified phase detector output signal that is indicative of a phase error that is a function of the phase error indicated by the phase detector output signal;
      a phase rotator adapted to generate, based on the modified phase detector output signal, a compensation signal having a phase that corresponds to the phase rotation to be applied to the digital downconverted signal; and
      a multiplier adapted to multiply the compensation signal and the digital downconverted signal to thereby apply the phase rotation to the digital downconverted signal.

2. The system of claim 1 wherein the phase rotation is a function of the phase error indicated by the modified phase detector output signal.

3. The system of claim 1 wherein the phase rotation is opposite to the phase error indicated by the modified phase detector output signal.

4. The system of claim 1 wherein the phase detector is a digital phase detector.

5. The system of claim 4 wherein the phase error in the local oscillator output signal indicted by the phase detector output signal comprises a phase error resulting from an interfering signal that falls outside a bandwidth of the phase locked loop but inside a bandwidth of the phase detector.

6. A method of compensating for a phase error in a signal derived from a local oscillator output signal output by a phase locked loop, comprising:
dividing the local oscillator output signal to thereby provide a frequency-divided local oscillator signal having a frequency that is a function of a frequency of the local oscillator output signal output by the phase locked loop;
downconverting a radio frequency signal based on the frequency-divided local oscillator signal to thereby provide a downconverted signal;
processing the downconverted signal to provide a digital downconverted signal;
dividing a phase detector output signal to provide a modified phase detector output signal indicative of a phase error that is a function of a phase error indicated by the phase detector output signal, the phase detector output signal being an output signal of a phase detector of the phase locked loop;
generating, based on the modified phase detector output signal, a compensation signal having a phase that corresponds to a phase rotation to be applied to the digital downconverted signal to compensate for a phase error in the digital downconverted signal resulting from a phase error in the local oscillator output signal indicated by the phase detector output signal; and
multiplying the compensation signal and the digital downconverted signal to thereby apply the phase rotation to the digital downconverted signal.

7. The method of claim 6 wherein generating the compensation signal comprises generating the compensation signal such that the phase rotation applied to the digital downconverted signal is opposite to the phase error indicated by the modified phase detector output signal.

8. The method of claim 6 wherein:
generating the compensation signal comprises generating the compensation signal via a phase rotator based on the modified phase detector output signal.

9. The method of claim 6 wherein the phase error in the local oscillator output signal indicted by the phase detector output signal comprises a phase error resulting from an interfering signal that falls outside a bandwidth of the phase locked loop but inside a bandwidth of the phase detector.

10. A wireless device, comprising:
a phase locked loop comprising:
a controlled oscillator adapted to provide a local oscillator output signal based on a control signal;
a phase detector adapted to generate a phase detector output signal that is indicative of a phase error between a feedback signal that is a function of the local oscillator output signal and a reference signal; and
a loop filter adapted to filter the phase detector output signal to provide the control signal for the controlled oscillator;
a receiver chain comprising a first divider circuit adapted to divide the local oscillator output signal to thereby provide a frequency-divided local oscillator signal having a frequency that is a function of a frequency of the local oscillator output signal, the receiver chain further being adapted to:
downconvert a radio frequency signal based on the frequency-divided local oscillator signal to thereby provide a downconverted signal; and
process the downconverted signal to provide a digital downconverted signal; and
an error compensation subsystem adapted to apply, based on the phase detector output signal, a phase rotation to the digital downconverted signal to thereby compensate for a phase error in the digital downconverted signal resulting from a phase error in the local oscillator output signal indicated by the phase detector output signal, wherein the error compensation subsystem comprises:
a second divider circuit adapted to divide the phase detector output signal to thereby provide a modified phase detector output signal that is indicative of a phase error that is a function of the phase error indicated by the phase detector output signal;
a phase rotator adapted to generate, based on the modified phase detector output signal, a compensation signal having a phase that corresponds to the phase rotation to be applied to the digital downconverted signal; and
a multiplier adapted to multiply the compensation signal and the digital downconverted signal to thereby apply the phase rotation to the digital downconverted signal.

11. A system comprising:
a phase locked loop comprising:
a controlled oscillator adapted to provide a local oscillator output signal based on a control signal;
a phase detector adapted to generate a phase detector output signal that is indicative of a phase error between a feedback signal that is a function of the local oscillator output signal and a reference signal; and
a loop filter adapted to filter the phase detector output signal to provide the control signal for the controlled oscillator;
a transmitter chain comprising a first divider circuit adapted to divide the local oscillator output signal to thereby provide a frequency-divided local oscillator signal having a frequency that is a function of a frequency of the local oscillator output signal, the transmitter chain further being adapted to upconvert an input signal from a first frequency to a second frequency based on the frequency-divided local oscillator signal to thereby provide an upconverted signal; and
an error compensation subsystem adapted to apply, based on the phase detector output signal, a phase rotation to the input signal to thereby compensate for a phase error in the upconverted signal resulting from a phase error in the local oscillator output signal indicated by the phase detector output signal, wherein the error compensation subsystem comprises:
a second divider circuit adapted to divide the phase detector output signal to thereby provide a modified phase detector output signal that is indicative of a phase error that is a function of the phase error indicated by the phase detector output signal;
a phase rotator adapted to generate, based on the modified phase detector output signal, a compensation signal having a phase that corresponds to the phase rotation to be applied to the input signal; and a multiplier adapted to multiply the compensation signal and the input signal to thereby apply the phase rotation to the input signal.

12. A method of compensating for a phase error in a signal derived from a local oscillator output signal output by a phase locked loop, comprising:

dividing the local oscillator output signal to thereby provide a frequency-divided local oscillator signal having a frequency that is a function of a frequency of the local oscillator output signal output by the phase locked loop;

upconverting an input signal from a first frequency to a second frequency based on the frequency-divided local oscillator signal to thereby provide an upconverted signal;

dividing a phase detector output signal to thereby provide a modified phase detector output signal that is indicative of a phase error that is a function of a phase error indicated by the phase detector output signal, the phase detector output signal being an output signal of a phase detector of the phase locked loop;

generating, based on the modified phase detector output signal, a compensation signal having a phase that corresponds to a phase rotation to be applied to the input signal to compensate for a phase error in the upconverted signal resulting from a phase error in the local oscillator output signal indicated by the phase detector output signal; and multiplying the compensation signal and the input signal to thereby apply the phase rotation to the input signal.

\* \* \* \* \*